(12) United States Patent
Yang et al.

(10) Patent No.: US 12,245,508 B2
(45) Date of Patent: Mar. 4, 2025

(54) THERMOELECTRIC ELEMENT

(71) Applicant: LG INNOTEK CO., LTD., Seoul (KR)

(72) Inventors: Tae Su Yang, Seoul (KR); Boone Won, Seoul (KR); Seung Hwan Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 180 days.

(21) Appl. No.: 18/026,868

(22) PCT Filed: Sep. 16, 2021

(86) PCT No.: PCT/KR2021/012659
§ 371 (c)(1),
(2) Date: Mar. 17, 2023

(87) PCT Pub. No.: WO2022/060112
PCT Pub. Date: Mar. 24, 2022

(65) Prior Publication Data
US 2023/0337541 A1    Oct. 19, 2023

(30) Foreign Application Priority Data
Sep. 18, 2020    (KR) .................. 10-2020-0120413

(51) Int. Cl.
*H10N 10/855*    (2023.01)
*H10N 10/17*    (2023.01)
(Continued)

(52) U.S. Cl.
CPC .......... *H10N 10/855* (2023.02); *H10N 10/17* (2023.02); *H10N 10/81* (2023.02); *H10N 10/8556* (2023.02)

(58) Field of Classification Search
None
See application file for complete search history.

(56) References Cited

U.S. PATENT DOCUMENTS

| | | | |
|---|---|---|---|
| 2010/0186424 A1* | 7/2010 | Horio | H10N 10/13 62/3.7 |
| 2020/0295248 A1 | 9/2020 | Negishi et al. | |

FOREIGN PATENT DOCUMENTS

| | | |
|---|---|---|
| JP | 2019-071403 | 5/2019 |
| KR | 10-2015-0098217 | 8/2015 |

(Continued)

OTHER PUBLICATIONS

International Search Report dated Dec. 17, 2021 issued in Application No. PCT/KR2021/012659.

*Primary Examiner* — Eli S Mekhlin
(74) *Attorney, Agent, or Firm* — KED & ASSOCIATES, LLP

(57) ABSTRACT

A thermoelectric element according to an embodiment of the present invention comprises: a first substrate; a first insulating layer disposed on the first substrate; a second insulating layer disposed on the first insulating layer; a first electrode disposed on the second insulating layer; a semiconductor structure disposed on the first electrode; a second electrode disposed on the semiconductor structure; and a second substrate disposed on the second electrode, wherein the composition of the first insulating layer is different from the composition of the second insulating layer, the first insulating layer includes a first region disposed on the first substrate and a second region disposed between the first region and the second insulating layer, and a particle size (D50) of an inorganic filler included in the second region is greater than the particle size (D50) of an inorganic filler included in the first region.

20 Claims, 11 Drawing Sheets

(51) Int. Cl.
*H10N 10/81* (2023.01)
*H10N 10/851* (2023.01)

(56) References Cited

FOREIGN PATENT DOCUMENTS

KR  10-2019-0139174  12/2019
KR  10-2020-0098415   8/2020

* cited by examiner

[FIG. 1]
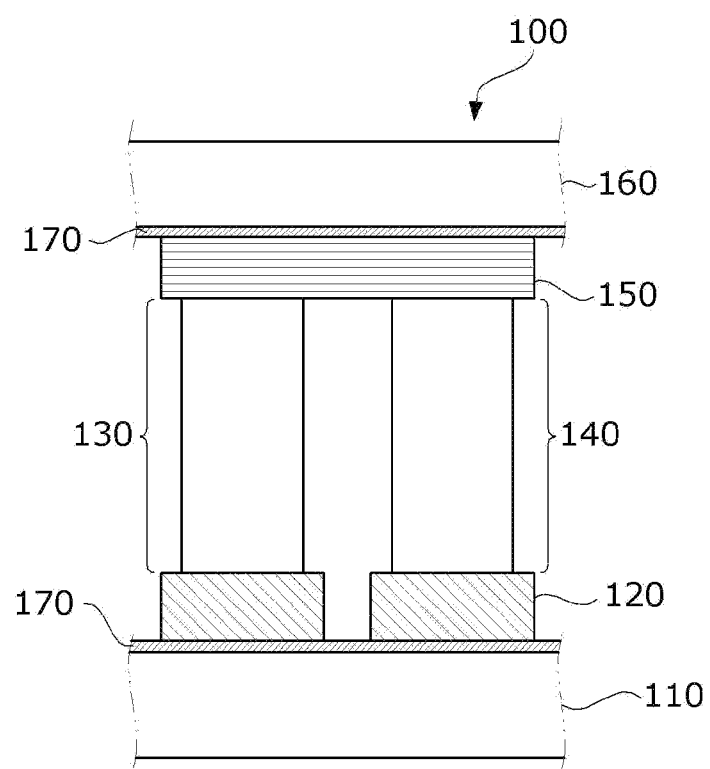

【FIG. 2】
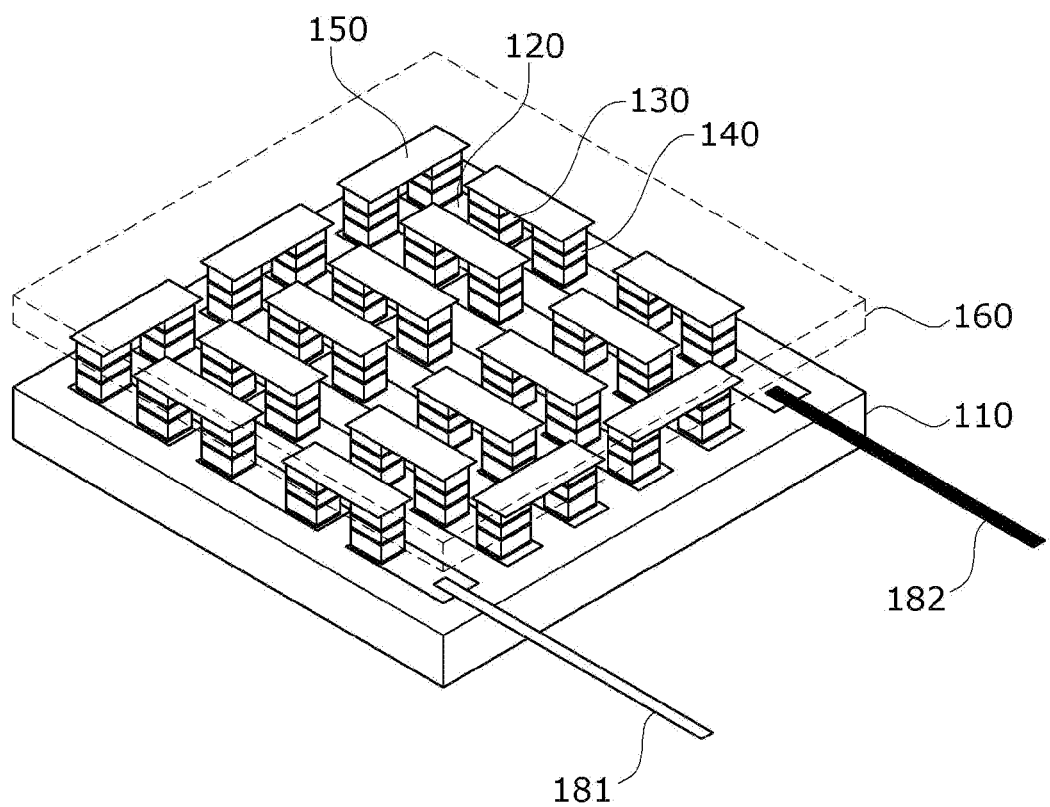

[FIG. 3]
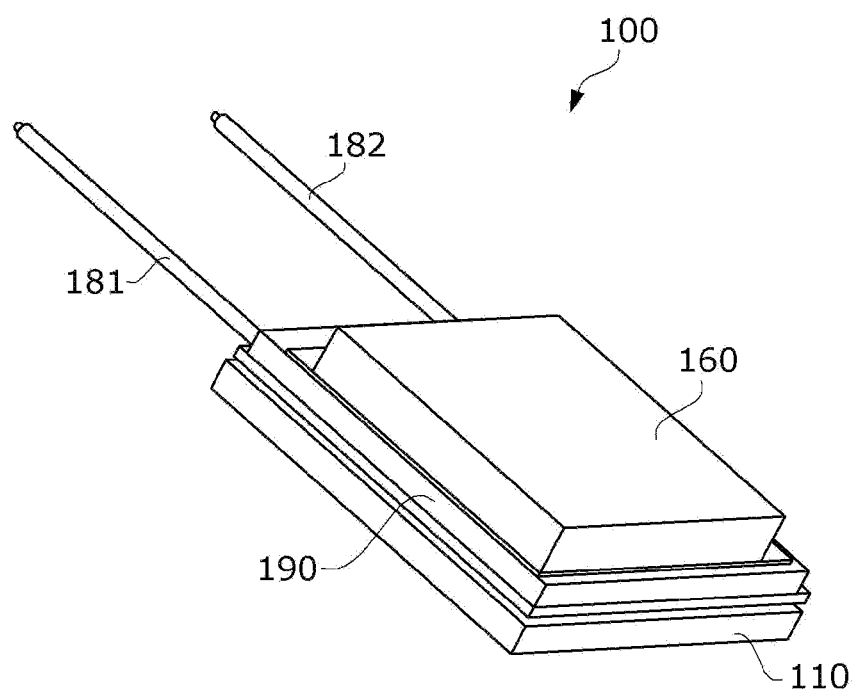

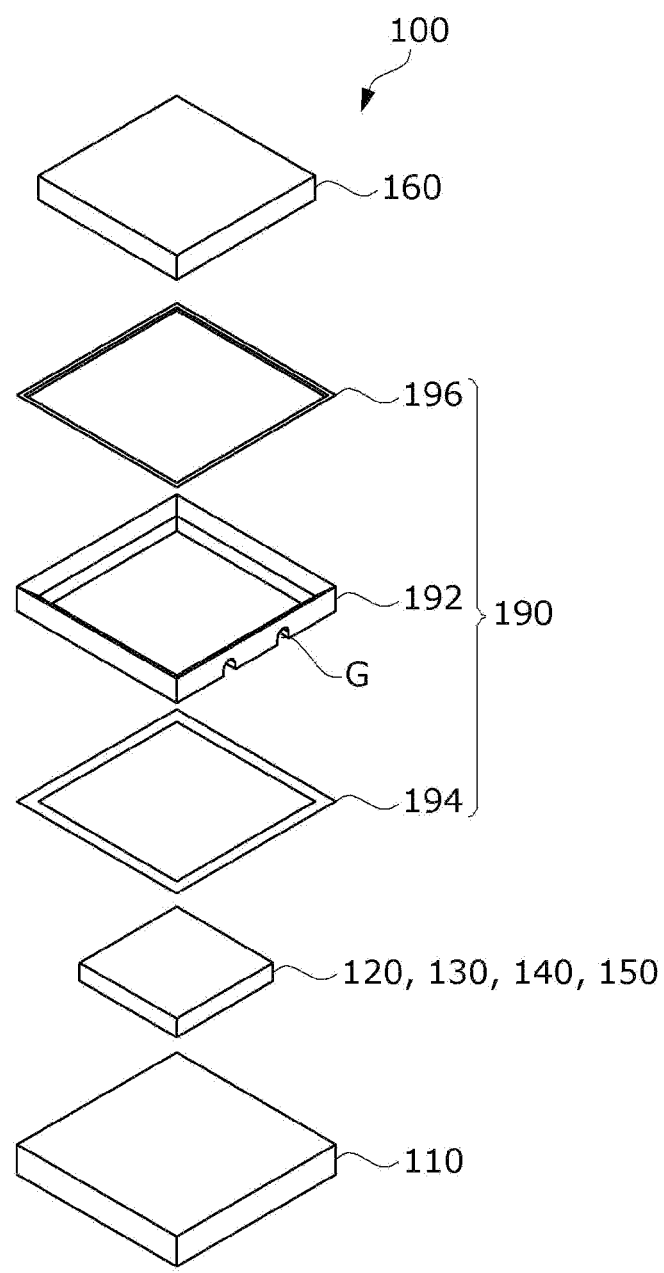
[FIG. 4]

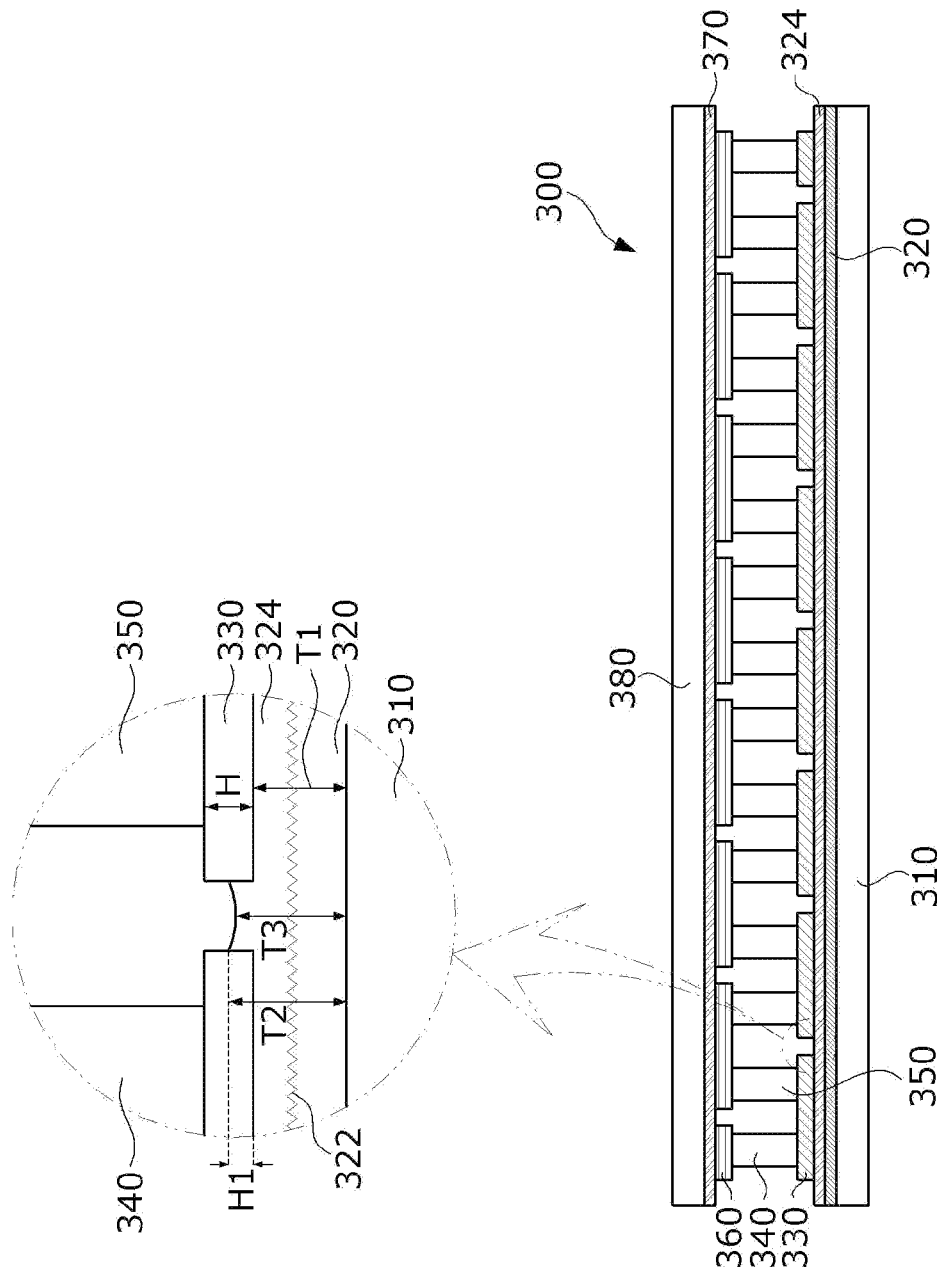
[FIG. 5]

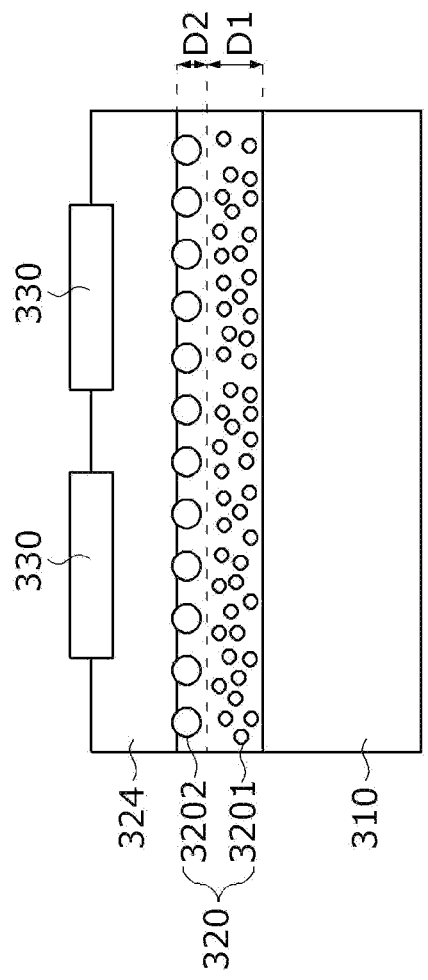
[FIG. 6]

[FIG. 7]
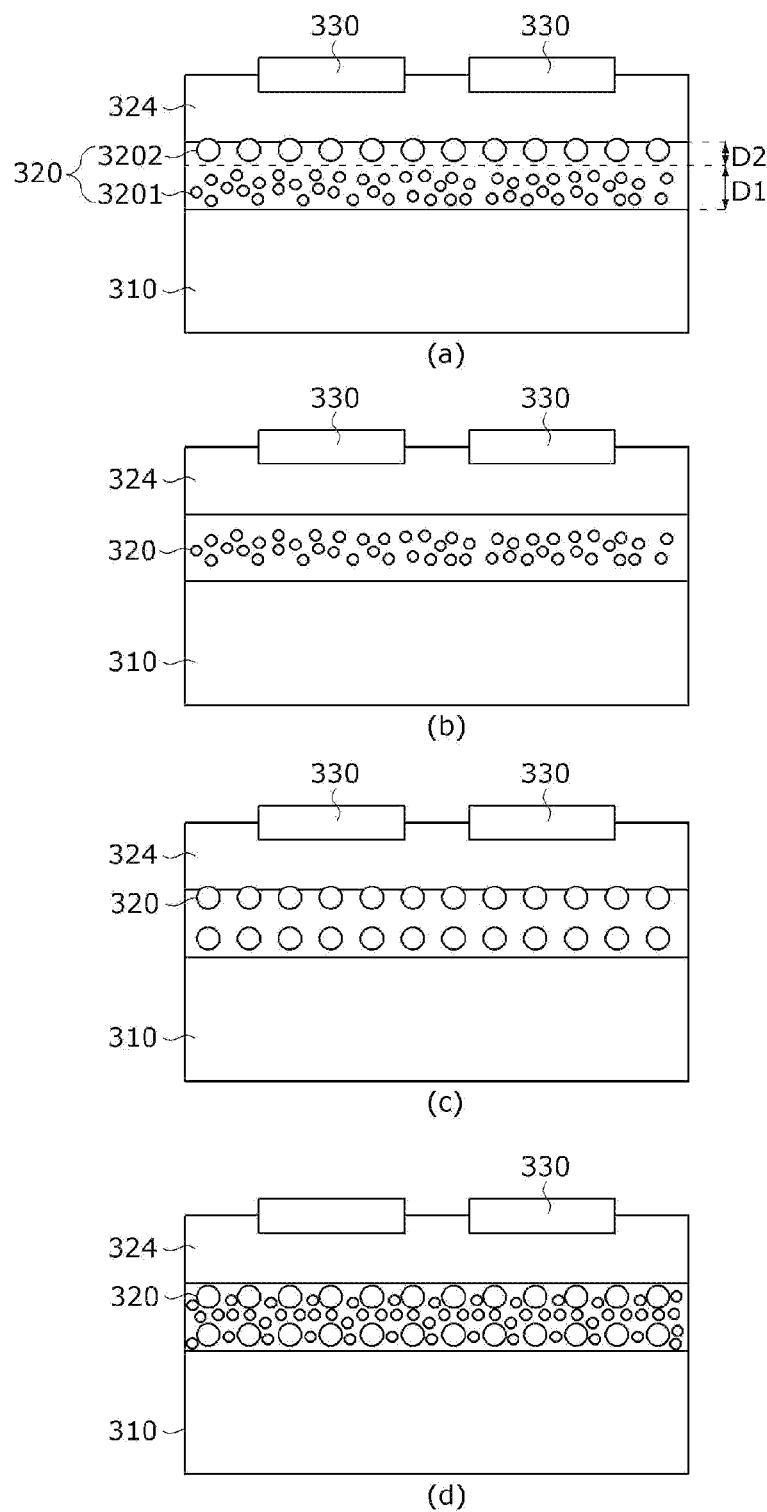

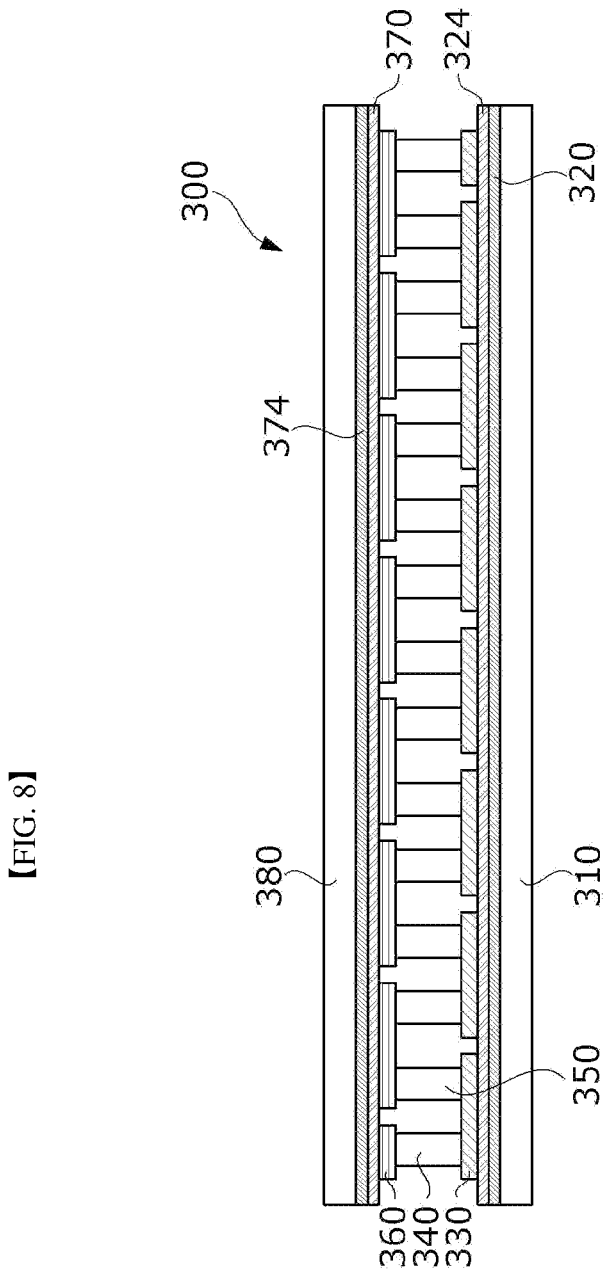
[FIG. 8]

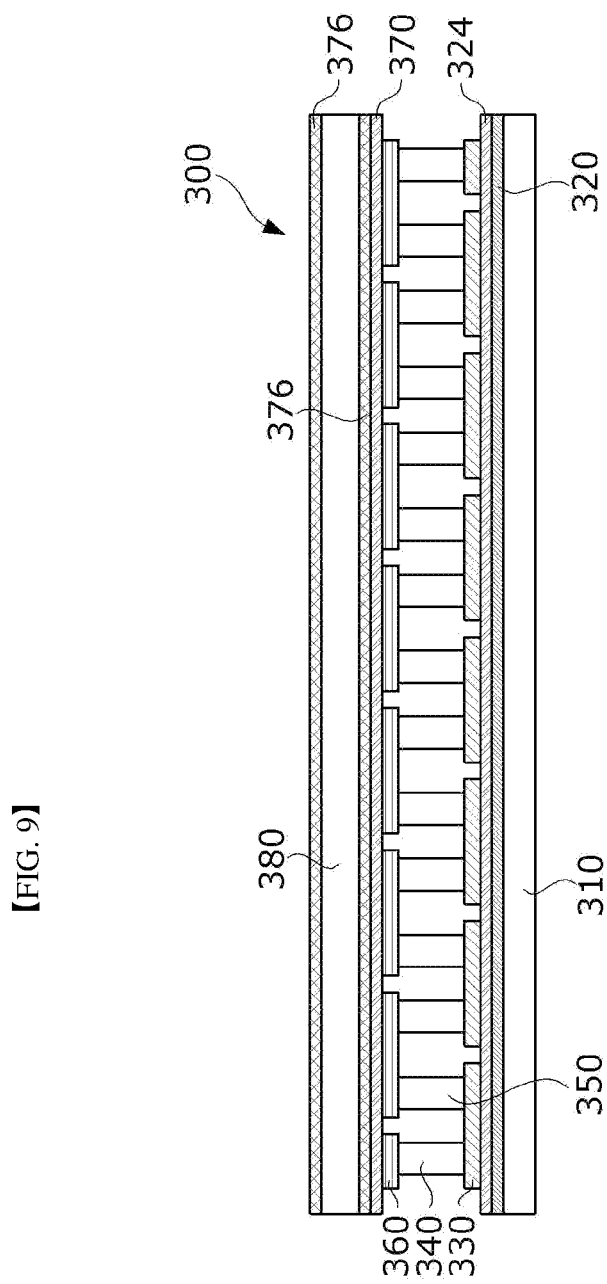
[FIG. 9]

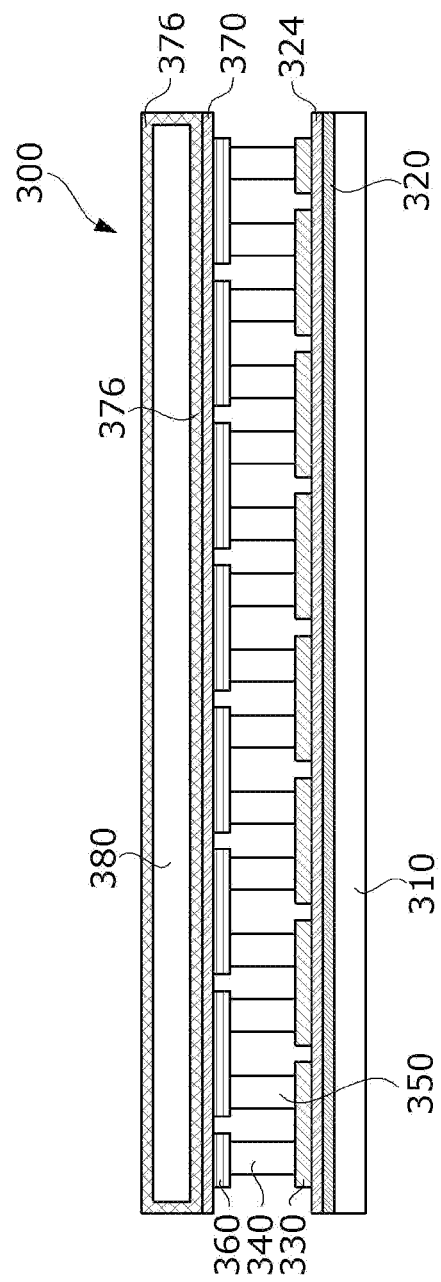

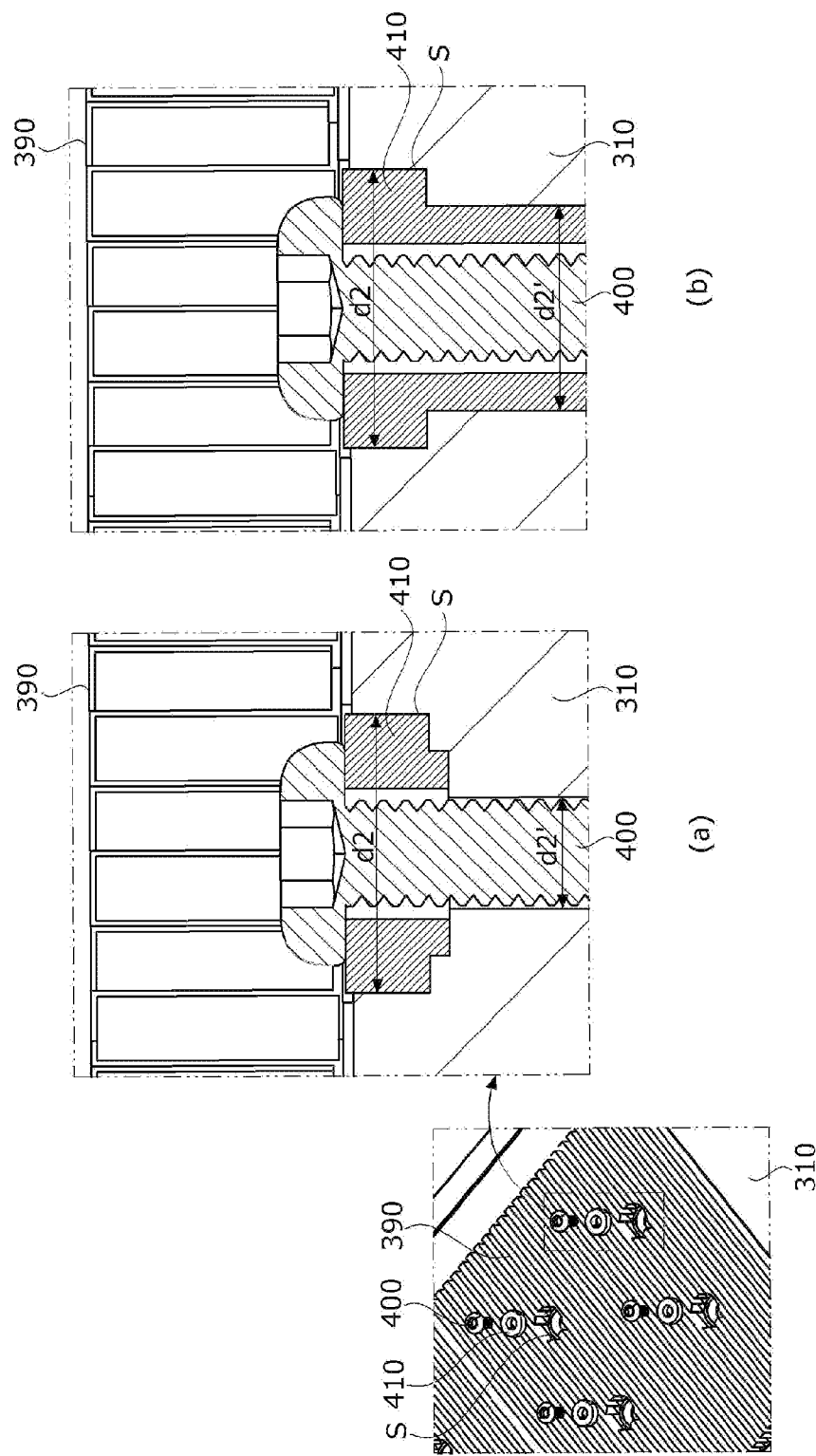
[FIG. 11]

THERMOELECTRIC ELEMENT

CROSS-REFERENCE TO RELATED PATENT APPLICATIONS

This application is a U.S. National Stage Application under 35 U.S.C. § 371 of PCT Application No. PCT/KR2021/012659, filed Sep. 16, 2021, which claims priority to Korean Patent Application No. 10-2020-0120413, filed Sep. 18, 2020, whose entire disclosures are hereby incorporated by reference.

TECHNICAL FIELD

The present invention relates to a thermoelectric element, and more specifically, to an insulating layer of a thermoelectric element.

BACKGROUND ART

A thermoelectric phenomenon is a phenomenon which occurs due to the movement of electrons and holes in a material, and refers to direct energy conversion between heat and electricity.

A thermoelectric element is a generic term for an element using the thermoelectric phenomenon and has a structure in which a P-type thermoelectric material and an N-type thermoelectric material are joined between metal electrodes to form a PN junction pair.

Thermoelectric elements can be classified into an element using temperature changes of electrical resistance, an element using the Seebeck effect, which is a phenomenon in which an electromotive force is generated due to a temperature difference, an element using the Peltier effect, which is a phenomenon in which heat absorption or heat generation by current occurs, and the like. The thermoelectric element is variously applied to home appliances, electronic components, communication components, or the like. For example, the thermoelectric element can be applied to a cooling device, a heating device, a power generation device, or the like. Accordingly, the demand for thermoelectric performance of the thermoelectric element is increasing more and more.

The thermoelectric element includes substrates, electrodes, and thermoelectric legs, wherein a plurality of thermoelectric legs are disposed in an array form between an upper substrate and a lower substrate, a plurality of upper electrodes are disposed between the plurality of thermoelectric legs and the upper substrate, and a plurality of lower electrodes are disposed between the plurality of thermoelectric legs and the lower substrate. In this case, one of the upper substrate and the lower substrate may be a low-temperature portion, and the other may be a high-temperature portion.

Meanwhile, in order to enhance the thermal conductivity performance of the thermoelectric element, attempts to use metal substrates are increasing.

Generally, the thermoelectric element can be manufactured according to a process of sequentially stacking electrodes and thermoelectric legs on a metal substrate which is prepared in advance. When the metal substrate is used, an advantageous effect can be acquired in terms of heat conduction, but there is a problem in that reliability is lowered when used for a long time due to a low withstand voltage. There are attempts to modify a composition or structure of an insulating layer disposed between the metal substrate and the electrodes to improve the withstand voltage of the thermoelectric element, but according to the composition or structure of the insulating layer, since the bonding strength between the substrate and the insulating layer or the bonding strength between the insulating layer and the electrodes is low, separation or delamination between the substrate, the insulating layer, and the electrodes can occur, and this can lower the thermal conductivity performance of the thermoelectric element.

DISCLOSURE

Technical Problem

The present invention is directed to providing a thermoelectric element in which both thermal conductivity performance and withstand voltage performance are improved.

Technical Solution

A thermoelectric element according to one embodiment of the present invention includes: a first substrate; a first insulating layer disposed on the first substrate; a second insulating layer disposed on the first insulating layer; a first electrode disposed on the second insulating layer; a semiconductor structure disposed on the first electrode; a second electrode disposed on the semiconductor structure; and a second substrate disposed on the second electrode, wherein a composition of the first insulating layer is different from a composition of the second insulating layer, the first insulating layer includes a first region disposed on the first substrate and a second region disposed between the first region and the second insulating layer, and a particle size (D50) of an inorganic filler included in the second region is greater than a particle size (D50) of an inorganic filler included in the first region.

A thickness of the first region may be greater than a thickness of the second region.

The thickness of the first region may be 1.2 to 3 times the thickness of the second region.

The thickness of the first region may be 1.5 to 2.5 times the thickness of the second region.

The particle size (D50) of particles included in the second region may be 5 μm to 15 μm, and the particle size (D50) of the inorganic filler included in the first region may be 0.1 μm to 3 μm.

An arithmetic average roughness (Ra) of a surface facing the second insulating layer in the second region may be 0.5 μm to 5 μm.

The inorganic filler may include aluminum oxide.

A portion of a side surface of the first electrode may be embedded in the second insulating layer.

The first insulating layer may include a composite including at least one of an Al—Si bond, an Al—O—Si bond, an Si—O bond, an Al—Si—O bond, and an Al—O bond, and the second insulating layer may be a resin layer formed of a resin composition including at least one of an epoxy resin and a silicone resin and an inorganic filler.

A thermoelectric element according to another embodiment of the present invention includes: a substrate; an insulating layer disposed on the substrate; an electrode disposed on the insulating layer; and a semiconductor structure disposed on the electrode, wherein the first insulating layer includes a first region disposed on the substrate, a second region disposed on the first region, and a third region disposed on the second region and where a portion of a side surface of the electrode is embedded, and a particle size (D50) of an inorganic filler included in the second region is greater than a particle size (D50) of an inorganic filler included in the first region.

The particle size (D50) of the inorganic filler included in the second region may be 5 µm to 15 µm, the particle size (D50) of the inorganic filler included in the first region may be 0.1 µm to 3 µm, and a thickness of the first region may be 1.2 to 3 times a thickness of the second region.

Advantageous Effects

According to an embodiment of the present invention, a thermoelectric element having excellent performance and high reliability can be acquired. Specifically, according to the embodiment of the present invention, the bonding strength between an insulating layer and electrodes can be improved, and accordingly, a thermoelectric element in which withstand voltage performance as well as thermal conductivity performance is improved can be acquired. Accordingly, when the thermoelectric element according to the embodiment of the present invention is applied to a power generation device, high power generation performance can be acquired, and when the thermoelectric element according to the embodiment of the present invention is applied to a cooling/heating device, high cooling or heating performance can be acquired.

A thermoelectric element according to the embodiment of the present invention can be applied not only to an application implemented in a small size but also to an application implemented in a large size such as a vehicle, a ship, a steel mill, an incinerator, or the like.

DESCRIPTION OF DRAWINGS

FIG. 1 is a cross-sectional view of a thermoelectric element.

FIG. 2 is a perspective view of the thermoelectric element.

FIG. 3 is a perspective view of the thermoelectric element including a sealing member.

FIG. 4 is an exploded perspective view of the thermoelectric element including the sealing member.

FIG. 5 is a cross-sectional view of a thermoelectric element according to one embodiment of the present invention.

FIG. 6 is a cross-sectional view of a structure between a substrate, an insulating layer, and electrodes of the thermoelectric element according to one embodiment of the present invention.

FIG. 7 (a) is a cross-sectional view of a bonding structure according to the embodiment, (b) is a cross-sectional view of a bonding structure according to Comparative Example 1, (c) is a cross-sectional view of a bonding structure according to Comparative Example 2, and (d) is a cross-sectional view of a bonding structure according to Comparative Example 3.

FIG. 8 is a cross-sectional view of a thermoelectric element according to another embodiment of the present invention.

FIG. 9 is a cross-sectional view of a thermoelectric element according to still another embodiment of the present invention.

FIG. 10 is a cross-sectional view of a thermoelectric element according to yet another embodiment of the present invention.

FIGS. 11 (a) and (b) illustrates a bonding structure of the thermoelectric element according to one embodiment of the present invention.

MODES OF THE INVENTION

Hereinafter, preferable embodiments of the present invention will be described in detail with reference to the accompanying drawings.

However, the technical spirit of the present invention is not limited to some embodiments which will be described and may be embodied in various forms, and one or more elements in the embodiments may be selectively combined and replaced to be used within the scope of the technical spirit of the present invention.

Further, terms used in the embodiments of the present invention (including technical and scientific terms), may be interpreted with meanings that are generally understood by those skilled in the art unless particularly defined and described, and terms which are generally used, such as terms defined in a dictionary, may be understood in consideration of their contextual meanings in the related art.

In addition, terms used in the description are provided not to limit the present invention but to describe the embodiments.

In the specification, the singular form may also include the plural form unless the context clearly indicates otherwise and may include one or more of all possible combinations of A, B, and C when disclosed as at least one (or one or more) of "A, B, and C."

In addition, terms such as first, second, A, B, (a), (b), and the like may be used to describe elements of the embodiments of the present invention.

Such terms are only provided to distinguish the elements from other elements, and the essence, sequence, order, or the like of the elements are not limited by the terms.

Further, when particular elements are disclosed as being "connected," "coupled," or "linked" to other elements, the elements may include not only a case of being directly connected, coupled, or linked to other elements but also a case of being connected, coupled, or linked to other elements by elements between the elements and other elements.

In addition, when one element is disclosed as being formed "on or under" another element, the term "on or under" includes both a case in which the two elements are in direct contact with each other and a case in which at least another element is disposed between the two elements (indirect contact). Further, when the term "on or under" is expressed, a meaning of not only an upward direction but also a downward direction may be included based on one element.

FIG. 1 is a cross-sectional view of a thermoelectric element, and FIG. 2 is a perspective view of the thermoelectric element. FIG. 3 is a perspective view of the thermoelectric element including a sealing member, and FIG. 4 is an exploded perspective view of the thermoelectric element including the sealing member.

Referring to FIGS. 1 and 2, a thermoelectric element 100 includes a lower substrate 110, lower electrodes 120, P-type thermoelectric legs 130, N-type thermoelectric legs 140, upper electrodes 150, and an upper substrate 160.

The lower electrodes 120 are disposed between the lower substrate 110 and lower bottom surfaces of the P-type thermoelectric legs 130 and the N-type thermoelectric legs 140, and the upper electrodes 150 are disposed between the upper substrate 160 and upper bottom surfaces of the P-type thermoelectric legs 130 and the N-type thermoelectric legs 140. Accordingly, a plurality of P-type thermoelectric legs 130 and a plurality of N-type thermoelectric legs 140 are electrically connected by the lower electrodes 120 and the upper electrodes 150. One pair of the P-type thermoelectric leg 130 and the N-type thermoelectric leg 140 which are disposed between the lower electrodes 120 and the upper electrode 150 and electrically connected to each other may form a unit cell.

For example, when a voltage is applied to the lower electrodes 120 and the upper electrodes 150 through lead lines 181 and 182, a substrate through which current flows from the P-type thermoelectric legs 130 to the N-type thermoelectric legs 140 due to the Peltier effect may absorb heat and act as a cooling unit, and a substrate through which current flows from the N-type thermoelectric legs 140 to the P-type thermoelectric legs 130 may be heated and act as a heating unit. Alternatively, when a temperature difference is applied between the lower electrode 120 and the upper electrode 150, electric charges in the P-type thermoelectric leg 130 and the N-type thermoelectric leg 140 may move due to the Seebeck effect, and thus electricity may be generated.

Although FIGS. 1 to 4 illustrate that the lead lines 181 and 182 are disposed on the lower substrate 110, the present invention is not limited thereto, and the lead lines 181 and 182 may be disposed on the upper substrate 160, or one of the lead lines 181 and 182 may be disposed on the lower substrate 110 and the other may be disposed on the upper substrate 160.

Here, the P-type thermoelectric leg 130 and the N-type thermoelectric leg 140 may be bismuth-telluride (Bi—Te)-based thermoelectric legs including bismuth (Bi) and tellurium (Te) as main raw materials. The P-type thermoelectric leg 130 may be a bismuth-telluride (Bi—Te)-based thermoelectric leg including at least one of antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may include Bi—Sb—Te, which is a main raw material, in an amount of 99 to 99.999 wt %, and may include at least one of nickel (Ni), aluminum (Al), copper (Cu), silver (Ag), lead (Pb), boron (B), gallium (Ga), and indium (In) in an amount of 0.001 to 1 wt % based on 100 wt % of the total weight. The N-type thermoelectric leg 140 may be a bismuth-telluride (Bi—Te)-based thermoelectric leg including at least one of selenium (Se), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may include Bi—Se—Te, which is a main raw material, in an amount of 99 to 99.999 wt %, and may include at least one of nickel (Ni), aluminum (Al), copper (Cu), silver (Ag), lead (Pb), boron (B), gallium (Ga), and indium (In) in an amount of 0.001 to 1 wt % based on 100 wt % of the total weight. Accordingly, in the present specification, the thermoelectric leg may also be referred to as a semiconductor structure, a semiconductor element, a semiconductor matter layer, a semiconductor substance layer, a semiconductor material layer, a conductive semiconductor structure, a thermoelectric structure, a thermoelectric matter layer, a thermoelectric substance layer, a thermoelectric material layer, or the like.

The P-type thermoelectric leg 130 and the N-type thermoelectric leg 140 may be formed in a bulk type or a stacked type. Generally, the bulk type P-type thermoelectric leg 130 or the bulk type N-type thermoelectric leg 140 may be acquired through a process of manufacturing an ingot by heat-treating a thermoelectric material, acquiring powder for thermoelectric legs by pulverizing and sieving the ingot, sintering the powder, and then cutting a sintered body. In this case, the P-type thermoelectric leg 130 and the N-type thermoelectric leg 140 may be polycrystalline thermoelectric legs. Like the above, when the P-type thermoelectric leg 130 and the N-type thermoelectric leg 140 are polycrystalline thermoelectric legs, the strength of the P-type thermoelectric leg 130 and the N-type thermoelectric leg 140 may be improved. The stacked type P-type thermoelectric leg 130 or the stacked type N-type thermoelectric leg 140 may be acquired through a process of forming a unit member by applying a paste including a thermoelectric material on a sheet-shaped base material, and then stacking and cutting the unit member.

In this case, one pair of the P-type thermoelectric leg 130 and the N-type thermoelectric leg 140 may have the same shape and volume or may have different shapes and volumes. For example, since electrical conduction characteristics of the P-type thermoelectric leg 130 and the N-type thermoelectric leg 140 are different, a height or cross-sectional area of the N-type thermoelectric leg 140 may be formed differently from a height or cross-sectional area of the P-type thermoelectric leg 130.

In this case, the P-type thermoelectric leg 130 or the N-type thermoelectric leg 140 may have a cylindrical shape, a polygonal columnar shape, an elliptical columnar shape, or the like.

Alternatively, the P-type thermoelectric leg 130 or the N-type thermoelectric leg 140 may have a stacked structure. For example, the P-type thermoelectric leg 130 or the N-type thermoelectric leg 140 may be formed using a method of stacking a plurality of structures in which a semiconductor material is applied on a sheet-shaped base material and then cutting the structures. Accordingly, material loss may be prevented and electrical conduction characteristics may be improved. Each structure may further include a conductive layer having an opening pattern, and accordingly, an adhesive force between the structures may be improved, thermal conductivity may be lowered, and electrical conductivity may be improved.

Alternatively, the P-type thermoelectric leg 130 or the N-type thermoelectric leg 140 may be formed to have different cross-sectional areas in one thermoelectric leg. For example, cross-sectional areas of both end portions disposed to face an electrode in one thermoelectric leg may be formed to be larger than a cross-sectional area between the both end portions. Accordingly, since a large temperature difference between both end portions may be formed, thermoelectric efficiency may be improved.

The performance of the thermoelectric element according to one embodiment of the present invention may be expressed as a thermoelectric figure of merit (ZT). The thermoelectric figure of merit (ZT) may be expressed as in Equation 1.

$$ZT = \alpha^2 \cdot \sigma \cdot T/k \qquad \text{[Equation 1]}$$

Here, α denotes the Seebeck coefficient [V/K], σ denotes electrical conductivity [S/m], and $\alpha^2\sigma$ denotes a power factor [W/mK$^2$]. Further, T denotes temperature, and k denotes thermal conductivity [W/mK]. k may be expressed as a·cp·ρ, wherein a denotes thermal diffusivity [cm$^2$/S], cp denotes specific heat [J/gK], and ρ denotes density [g/cm$^3$].

In order to acquire the thermoelectric figure of merit of the thermoelectric element, a Z value (V/K) may be measured using a Z meter, and the thermoelectric figure of merit (ZT) may be calculated using the measured Z value.

Here, each of the lower electrodes 120 disposed between the lower substrate 110 and the P-type thermoelectric leg 130 and the N-type thermoelectric leg 140 and the upper electrode 150 disposed between the upper substrate 160 and the P-type thermoelectric leg 130 and the N-type thermoelectric leg 140 may include at least one of copper (Cu), silver (Ag), aluminum (Al), and nickel (Ni), and may have a thickness of 0.01 mm to 0.3 mm. When the thickness of the lower electrode 120 or the upper electrode 150 is smaller than 0.01 mm, the function as an electrode may be deteriorated and the electrical conduction performance may be lowered, and when the thickness of the lower electrode 120 or the upper electrode 150 exceeds 0.3 mm, conduction efficiency may be lowered due to an increase in resistance.

Further, the lower substrate 110 and the upper substrate 160 opposite each other may be metal substrates, and each thickness thereof may be 0.1 mm to 1.5 mm. When the thickness of the metal substrate is smaller than 0.1 mm or exceeds 1.5 mm, since heat dissipation characteristics or thermal conductivity may be excessively high, the reliability of the thermoelectric element may be deteriorated. Further, when the lower substrate 110 and the upper substrate 160 are metal substrates, insulating layers 170 may be further formed between the lower substrate 110 and the lower electrode 120 and between the upper substrate 160 and the upper electrode 150. The insulating layer 170 may include a material having a thermal conductivity of 1 to 20 W/mK.

In this case, the lower substrate 110 and the upper substrate 160 may be formed to have different sizes. For example, a volume, thickness, or area of one of the lower substrate 110 and the upper substrate 160 may be formed to be greater than a volume, thickness, or area of the other. Accordingly, it is possible to improve the heat absorption performance or heat dissipation performance of the thermoelectric element. For example, at least one of a volume, a thickness, and an area of a substrate disposed in a high temperature region for the Seebeck effect, applied as a heating region for the Peltier effect, or on which a sealing member for protecting the thermoelectric module from an external environment is disposed may be greater than at least one of a volume, a thickness, and an area of the other substrate.

Further, a heat dissipation pattern, for example, a concavo-convex pattern may be formed on the surface of at least one of the lower substrate 110 and the upper substrate 160. Accordingly, the heat dissipation performance of the thermoelectric element may be improved. When the concavo-convex pattern is formed on the surface which comes into contact with the P-type thermoelectric leg 130 or the N-type thermoelectric leg 140, bonding characteristics between the thermoelectric leg and the substrate may also be improved. The thermoelectric element 100 includes the lower substrate 110, the lower electrodes 120, the P-type thermoelectric legs 130, the N-type thermoelectric legs 140, the upper electrodes 150, and the upper substrate 160.

As shown in FIGS. 3 and 4, a sealing member 190 may be further disposed between the lower substrate 110 and the upper substrate 160. The sealing member 190 may be disposed on side surfaces of the lower electrodes 120, the P-type thermoelectric legs 130, the N-type thermoelectric legs 140, and the upper electrodes 150 between the lower substrate 110 and the upper substrate 160. Accordingly, the lower electrodes 120, the P-type thermoelectric legs 130, the N-type thermoelectric legs 140, and the upper electrodes 150 may be sealed from external moisture, heat, contamination, and the like. Here, the sealing member 190 may include a sealing case 192 disposed to be spaced apart a predetermined distance from outermost side surfaces of the plurality of lower electrodes 120, the plurality of P-type thermoelectric legs 130 and the plurality of N-type thermoelectric legs 140, and the plurality of upper electrodes 150, a sealing material 194 disposed between the sealing case 192 and the lower substrate 110, and a sealing material 196 disposed between the sealing case 192 and the upper substrate 160. Like the above, the sealing case 192 may come into contact with the lower substrate 110 and the upper substrate 160 through the sealing materials 194 and 196. Accordingly, when the sealing case 192 comes into direct contact with the lower substrate 110 and the upper substrate 160, heat conduction occurs through the sealing case 192, and as a result, a problem in that a temperature difference between the lower substrate 110 and the upper substrate 160 is lowered may be prevented. Here, the sealing materials 194 and 196 may include at least one of an epoxy resin and a silicone resin, or a tape in which at least one of the epoxy resin and the silicone resin is applied on both surfaces. The sealing materials 194 and 194 may serve to seal between the sealing case 192 and the lower substrate 110 and between the sealing case 192 and the upper substrate 160, may improve a sealing effect of the lower electrodes 120, the P-type thermoelectric legs 130, the N-type thermoelectric legs 140, and the upper electrodes 150, and may be used interchangeably with a finishing material, a finishing layer, a waterproofing material, a waterproofing layer, and the like. Here, the sealing material 194 which seals between the sealing case 192 and the lower substrate 110 is disposed on an upper surface of the lower substrate 110, and the sealing material 196 which seals between the sealing case 192 and the upper substrate 160 may be disposed on side surfaces of the upper substrate 160. Meanwhile, guide grooves G for drawing out the lead lines 180 and 182 connected to the electrodes may be formed in the sealing case 192. To this end, the sealing case 192 may be an injection-molded product formed of plastic or the like, and may be used interchangeably with a sealing cover. However, the above description of the sealing member is only an example, and the sealing member may be modified into various forms. Although not shown in the drawings, a thermal insulating material may be further included to surround the sealing member. Alternatively, the sealing member may include a thermal insulating component.

In the above, although the terms "lower substrate 110, lower electrode 120, upper electrode 150, and upper substrate 160" are used, they are only arbitrarily referred to as upper and lower portions for ease of understanding and convenience of description, and positions may be reversed so that the lower substrate 110 and the lower electrode 120 may be disposed at an upper portion, and the upper electrode 150 and the upper substrate 160 may be disposed at a lower portion.

Meanwhile, as described above, in order to improve the thermal conductivity of the thermoelectric element, attempts to use a metal substrate are increasing. However, when the thermoelectric element includes a metal substrate, an advantageous effect may be acquired in terms of thermal conduction, but there is a problem in that a withstand voltage is lowered. Specifically, when the thermoelectric element is applied under a high voltage condition, withstand voltage performance of 2.5 kV or more is required. In order to improve the withstand voltage performance of the thermoelectric element, a plurality of insulating layers having different compositions may be disposed between the metal substrate and the electrode. However, due to a low interfacial adhesion force between the plurality of insulating layers, shear stress due to a difference in thermal expansion coefficient between the plurality of insulating layers may occur when the insulating layers are exposed to a high temperature such as in a reflow environment, and accordingly, the bonding of an interface between the plurality of insulating layers may be destroyed. Separation of the interface between the plurality of insulating layers may increase the thermal resistance of the substrate, and accordingly, a temperature difference of both ends of the thermoelectric element may be reduced, and when the thermoelectric element is applied to the power generation device, the power generation performance of the power generation device may be reduced.

According to the embodiment of the present invention, a thermoelectric element in which both the thermal conductivity performance and the withstand voltage performance are improved is acquired by improving the bonding strength of the interface between the plurality of insulating layers.

FIG. 5 is a cross-sectional view of a thermoelectric element according to one embodiment of the present invention, and FIG. 6 is a cross-sectional view of a structure between a substrate, an insulating layer, and electrodes of the thermoelectric element according to one embodiment of the present invention. Overlapping descriptions of the content the same as the content described with reference to FIGS. 1 to 4 will be omitted.

Referring to FIGS. 5 and 6, a thermoelectric element 300 according to the embodiment of the present invention includes a first substrate 310, a first insulating layer 320 disposed on the first substrate 310, and a second insulating layer 324 disposed on the first insulating layer 320, a plurality of first electrodes 330 disposed on the second insulating layer 324, a plurality of P-type thermoelectric legs 340 and a plurality of N-type thermoelectric legs 350 disposed on the plurality of first electrodes 330, a plurality of second electrodes 360 disposed on the plurality of P-type thermoelectric legs 340 and the plurality of N-type thermoelectric legs 350, a third insulating layer 370 disposed on the plurality of second electrodes 360, and a second substrate 380 disposed on the third insulating layer 370. Descriptions of the first substrate 110, the first electrodes 120, the P-type thermoelectric legs 130, the N-type thermoelectric legs 140, the second electrodes 150, and the second substrate 160 in FIGS. 1 to 4 may be equally applied to the first substrate 310, the first electrodes 330, the P-type thermoelectric legs 340, the N-type thermoelectric legs 350, the second electrodes 360, and the second substrate 380.

Although not shown in FIGS. 5 and 6, a heat sink may be further disposed on the first substrate 310 or the second substrate 380, and a sealing member may be further disposed between the first substrate 310 and the second substrate 380.

For example, a wire may be connected to a low-temperature portion side of the thermoelectric element 300. In addition, equipment for an application to which the thermoelectric element 300 is applied may be mounted on a high-temperature portion side of the thermoelectric element 300. For example, equipment for a ship may be mounted on the high-temperature portion side of the thermoelectric element 300. Accordingly, withstand voltage performance may be required at both the low-temperature portion side and the high-temperature portion side of the thermoelectric element 300.

Meanwhile, higher thermal conductivity may be required at the high-temperature portion side of the thermoelectric element 300 compared to the low-temperature portion side of the thermoelectric element 300. A copper substrate has higher thermal conductivity and higher electrical conductivity compared to an aluminum substrate. In order to satisfy both thermal conductivity performance and withstand voltage performance, among the first substrate 310 and the second substrate 380, the substrate disposed at the low-temperature portion side of the thermoelectric element 300 may be an aluminum substrate, and the substrate disposed at the high-temperature portion side of the thermoelectric element 300 may be a copper substrate, but the present invention is not limited thereto. However, when the substrate disposed at the low-temperature portion side of the thermoelectric element 300 is the aluminum substrate, and the substrate disposed at the high-temperature portion side of the thermoelectric element 300 is the copper substrate, since the electrical conductivity of the copper substrate is higher than the electrical conductivity of the aluminum substrate, a separate configuration may be required to maintain the withstand voltage performance of the high-temperature portion side of the thermoelectric element 300.

Accordingly, according to the embodiment of the present invention, the first insulating layer 320 and the second insulating layer 324 are disposed on the first substrate 310, and the first electrodes 330 are disposed on the second insulating layer 324. The first insulating layer 320 and the second insulating layer 324 may have different compositions. Here, different compositions may mean that types of materials are different, or may mean that the types of materials are the same but the contents are different.

For example, the first insulating layer 320 may include a composite including silicon and aluminum and an inorganic filler. Here, the composite may be an organic-inorganic composite composed of an inorganic substance including an Si element and an Al element and an alkyl chain, and may be at least one of an oxide, a carbide, and a nitride including silicon and aluminum. For example, the composite may include at least one of an Al—Si bond, an Al—O—Si bond, an Si—O bond, an Al—Si—O bond, and an Al—O bond. Like the above, the composite including at least one of the Al—Si bond, the Al—O—Si bond, the Si—O bond, the Al—Si—O bond, and the Al—O bond may have excellent insulation performance, and accordingly, high withstand voltage performance may be acquired. Alternatively, the composite may be an oxide, carbide, or nitride further including titanium, zirconium, boron, zinc, etc. along with silicon and aluminum. To this end, the composite may be acquired through a process of heat treatment after mixing at least one of an inorganic binder and an organic-inorganic mixed binder with aluminum. The inorganic binder may include, for example, at least one of silica ($SiO_2$), metal alkoxide, boron oxide ($B_2O_3$), and zinc oxide ($ZnO_2$). The inorganic binder is an inorganic particle, but may form a sol or gel to serve as a binder when coming into contact with water. In this case, at least one of the silica ($SiO_2$), the metal alkoxide, and the boron oxide ($B_2O_3$) serves to improve the adhesion between aluminum or with the first substrate 310, and the zinc oxide ($ZnO_2$) may serve to improve the strength of the first insulating layer 320 and improve thermal conductivity. The inorganic filler may be dispersed in the composite and may include at least one of aluminum oxide and a nitride. Here, the nitride may include at least one of boron nitride and aluminum nitride.

Meanwhile, the second insulating layer 324 may be formed of a resin layer including at least one of an epoxy resin composition including an epoxy resin and an inorganic filler and a silicone resin composition including polydimethylsiloxane (PDMS). Accordingly, the second insulating layer 324 may improve insulating properties, bonding strength, and thermal conductivity between the first insulating layer 320 and the first electrodes 330.

Here, the inorganic filler may be included in an amount of 60 to 80 wt % of the resin layer. When the inorganic filler is included in an amount less than 60 wt %, thermal conductivity may be low, and when the inorganic filler is included in an amount more than 80 wt %, it may be difficult to uniformly disperse the inorganic filler in the resin, and the resin layer may be easily broken.

Further, the epoxy resin may include an epoxy compound and a curing agent. In this case, the curing agent may be included in a volume ratio of 1 to 10 based on a volume ratio of 10 of the epoxy compound. Here, the epoxy compound may include at least one of a crystalline epoxy compound, an amorphous epoxy compound, and a silicone epoxy compound. The inorganic filler may include at least one of aluminum oxide and a nitride. Here, the nitride may include at least one of boron nitride and aluminum nitride.

In this case, a particle size D50 of a boron nitride agglomerate may be 250 to 350 μm, and a particle size D50 of the aluminum oxide may be 10 to 30 μm. When the particle size D50 of the boron nitride agglomerate and the particle size D50 of the aluminum oxide satisfy these numerical ranges, the boron nitride agglomerate and the aluminum oxide may be uniformly dispersed in the resin layer, and accordingly, the resin layer may have a uniform heat conduction effect and uniform adhesion performance as a whole.

When the second insulating layer 324 is a resin composition including a polydimethylsiloxane (PDMS) resin and aluminum oxide, the content (for example, a weight ratio) of silicon in the first insulating layer 320 may be greater than the content of silicon in the second insulating layer 324, and the content of aluminum in the second insulating layer 324 may be greater than the content of aluminum in the first insulating layer 320. Accordingly, silicon in the first insulating layer 320 may mainly contribute to an improvement in withstand voltage performance, and the aluminum oxide in the second insulating layer 324 may mainly contribute to an improvement in thermal conductivity performance. Accordingly, both the first insulating layer 320 and the second insulating layer 324 have insulation performance and thermal conductivity performance, and the withstand voltage performance of the first insulating layer 320 may be greater than the withstand voltage performance of the second insulating layer 324, and the thermal conductivity performance of the second insulating layer 324 may be greater than the thermal conductivity performance of the first insulating layer 320.

Meanwhile, the second insulating layer 324 is formed by a method of applying a resin composition in an uncured state or a semi-cured state on the first insulating layer 320, and then disposing and pressing a plurality of pre-aligned first electrodes 330. Accordingly, portions of side surfaces of the plurality of first electrodes 330 may be embedded in the second insulating layer 324. In this case, a height H1 of each of the side surfaces of the plurality of first electrodes 330 buried in the second insulating layer 324 may be 0.1 to 1 times, preferably 0.2 to 0.9 times, and more preferably 0.3 to 0.8 times a thickness H of each of the plurality of first electrodes 330. Like the above, when some of the side surfaces of the plurality of first electrodes 330 are embedded in the second insulating layer 324, contact areas between the plurality of first electrodes 330 and the second insulating layer 324 are widened, and accordingly, thermal transfer performance and bonding strength between the plurality of first electrodes 330 and the second insulating layer 324 may be further improved. When the height H1 of each of the side surfaces of the plurality of first electrodes 330 buried in the second insulating layer 324 is less than 0.1 times the thickness H of each of the plurality of first electrodes 330, it may be difficult to acquire sufficient thermal transfer performance and bonding strength between the plurality of first electrodes 330 and the second insulating layer 324, and when the height H1 of each of the side surfaces of the plurality of first electrodes 330 embedded in the second insulating layer 324 exceeds 1 time the thickness H of each of the plurality of first electrodes 330, the second insulating layer 324 may rise to the top of the plurality of first electrodes 330, and accordingly, there is the possibility of an electrical short circuit.

More specifically, since a thickness of the second insulating layer 324 decreases from the side surface of each electrode to a center region between the plurality of first electrodes 330, an apex may have a gentle 'V' shape. Accordingly, the insulating layers 320 and 324 between the plurality of first electrodes 330 may have a thickness variation, a height T2 in a region which comes into direct contact with the side surfaces of the plurality of first electrodes 330 may be the highest, and a height T3 in a center region may be lower than the height T2 in the region which comes into direct contact with the side surfaces of the plurality of first electrodes 330. That is, the height T3 of the insulating layers 320 and 324 in the center region between the plurality of first electrodes 330 may be the lowest in the insulating layers 320 and 324 between the plurality of first electrodes 330. Further, a height T1 of the insulating layers 320 and 324 under the plurality of first electrodes 330 may lower than the height T3 of the insulating layers 320 and 324 in the center region between the plurality of first electrodes 330.

Meanwhile, the compositions of the first insulating layer 320 and the second insulating layer 324 are different from each other, and accordingly, at least one of the hardness, modulus of elasticity, tensile strength, elongation rate, and Young's modulus of the first insulating layer 320 and the second insulating layer 324 may vary, and accordingly, it is possible to control withstand voltage performance, thermal conductivity performance, bonding performance, thermal shock alleviation performance, and the like.

For example, a weight ratio of the composite and the inorganic filler with respect to the entire first insulating layer 320 may be greater than a weight ratio of the inorganic filler with respect to the entire second insulating layer 324. As described above, the composite may be a composite including silicon and aluminum, more specifically, a composite including at least one of an oxide, a carbide, and a nitride including silicon and aluminum. For example, a weight ratio of ceramics, that is, the composite and the inorganic filler, with respect to the entire first insulating layer 320 exceeds 80 wt %, and a weight ratio of ceramics, that is, the inorganic filler with respect to the entire second insulating layer 324 may be 60 to 80 wt %. Like the above, when the content of the composite and the inorganic filler included in the first insulating layer 320 is greater than the content of the inorganic filler included in the second insulating layer 324, the hardness of the first insulating layer 320 may be greater than the hardness of the second insulating layer 324. Accordingly, the first insulating layer 320 may simultaneously have high withstand voltage performance and high thermal conductivity, the second insulating layer 324 may have greater elasticity than the first insulating layer 320, and the second insulating layer 324 may improve adhesion performance between the first insulating layer 320 and the first electrode 330 and alleviate thermal shock when the thermoelectric element 300 is driven. In this case, elasticity may be expressed as tensile strength. For example, the tensile strength of the second insulating layer 324 may be 2 to 5 MPa, preferably 2.5 to 4.5 MPa, and more preferably 3 to 4 MPa, and the tensile strength of the first insulating layer 320 may be 10 MPa to 100 MPa, preferably 15 MPa to 90 MPa, and more preferably 20 MPa to 80 MPa.

In this case, the thickness of the second insulating layer 324 may be greater than 1 time and 3.5 times or less, preferably 1.05 times or more and 2 times or less, and more preferably 1.1 times or more and 1.5 times or less the thickness of the first insulating layer 320. For example, the thickness of the first insulating layer 320 is 35 µm or less, and the thickness of the second insulating layer 324 may be greater than 35 µm and 80 µm or less, preferably greater than 35 µm and 70 µm or less, and more preferably greater than 35 µm and 50 µm or less.

When the thickness of the first insulating layer 320 and the thickness of the second insulating layer 324 satisfy these numerical ranges, it is possible to simultaneously acquire withstand voltage performance, thermal conductivity performance, bonding performance, and thermal shock alleviation performance.

Meanwhile, when the substrate at the high-temperature portion side is exposed to a high temperature during a reflow process in a process of manufacturing the thermoelectric element 300 or is frequently exposed to a high temperature when the thermoelectric element 300 is driven, shear stress is applied to the interface between the first insulating layer 320 and the second insulating layer 324 due to a difference in thermal expansion coefficient between the first insulating layer 320 and the second insulating layer 324, and accordingly, lifting occurs at the interface between the first insulating layer 320 and the second insulating layer 324, and thermal resistance rises. Accordingly, the bonding strength between the first insulating layer 320 and the second insulating layer 324 may affect the performance of the thermoelectric element 300, and may greatly affect power generation performance when the thermoelectric element 300 is applied to a power generation device.

According to the embodiment of the present invention, in order to improve the bonding strength between the first insulating layer 320 and the second insulating layer 324, a surface roughness is formed on a surface among both surfaces of the first insulating layer 320, which comes into contact with the second insulating layer 324.

Referring to FIG. 6, the first insulating layer 320 is disposed on the first substrate 310, the second insulating layer 324 is disposed on the first insulating layer 320, and the plurality of first electrodes 330 are disposed on the second insulating layer 324. Here, in relation to the first substrate 310, the first insulating layer 320, the second insulating layer 324, and the plurality of first electrodes 330, overlapping descriptions of the content the same as the content described with reference to FIG. 5 will be omitted.

According to the embodiment of the present invention, the first insulating layer 320 includes a first region 3201 disposed on the first substrate 310 and a second region 3202 disposed between the first region 3201 and the second insulating layer 324. In this case, a particle size D50 of an inorganic filler included in the second region 3202 may be different from a particle size D50 of an inorganic filler included in the first region 3201, and the particle size D50 of the inorganic filler included in the second region 3202 may be greater than the particle size D50 of the inorganic filler included in the first region 3201. In this case, the inorganic filler may include at least one of boron nitride and aluminum oxide. The larger the particle size D50 of the inorganic filler, the easier it is to form the surface roughness on the surface of the first insulating layer 320, and the bonding strength between the first insulating layer 320 and the second insulating layer 324 may be improved, but the thermal conductivity in the first insulating layer 320 may decrease due to an increase in distance between the inorganic fillers. On the other hand, the smaller the particle size D50 of the inorganic filler, the shorter the distance between the inorganic fillers and thus the thermal conductivity in the first insulating layer 320 may increase, but it may be difficult to form the surface roughness on the surface of the first insulating layer 320.

According to the embodiment of the present invention, when the particle size D50 of the inorganic filler included in the second region 3202 disposed on the second insulating layer 324 side is greater than the particle size D50 of the inorganic filler included in the first region 3201 disposed on the first substrate 310 side, the surface roughness may be formed on a surface among both surfaces of the first insulating layer 320, which is bonded to the second insulating layer 324, and accordingly, not only the bonding strength between the first insulating layer 320 and the second insulating layer 324 may be improved, but also the thermal conductivity of the first insulating layer 320 may be increased. FIG. 6 illustrates that each of the first region 3201 and the second region 3202 includes an inorganic filler having the same size, but the present invention is not limited thereto. This may mean that both the first region 3201 and the second region 3202 include inorganic fillers having different sizes, and the particle size D50 of the inorganic filler included in the second region 3202 is greater than the particle size D50 of the inorganic filler included in the first region 3201. In the present specification, the particle size D50 refers to a particle size in which a cumulative percentage reaches 50% as a result of particle size analysis. For example, the particle size D50 may mean that 50% of particles larger than the corresponding particle size exist and 50% of particles smaller than the corresponding particle size exist. In the present specification, a boundary between the first region 3201 and the second region 3202 in the first insulating layer 320 may refer to a region in which a change rate of the particle size D50 is greatest in a direction from the first substrate 310 to the second insulating layer 324.

According to the embodiment of the present invention, a thickness D1 of the first region 3201 may be greater than a thickness D2 of the second region 3202. For example, the thickness D1 of the first region 3201 may be 1.2 to 3 times, preferably 1.5 to 2.5 times, and more preferably 1.75 to 2.25 times the thickness D2 of the second region 3202. As described above, the inorganic filler included in the second region 3202 may serve to improve bonding strength with the second insulating layer 324 by forming a surface roughness on the surface of the first insulating layer 320, and the inorganic filler included in the first region 3202 may serve to improve the thermal conductivity of the first insulating layer 320. When the thickness D1 of the first region 3201 and the thickness D2 of the second region 3202 satisfy these conditions, the first insulating layer 320 may have high bonding strength with the second insulating layer 324, and may also have high thermal conductivity.

In this case, the particle size D50 of the inorganic filler included in the second region 3202 may be 5 µm to 15 µm, and preferably 7 µm to 12 µm, and the particle size D50 of the inorganic filler included in the first region 3201 may be 0.1 µm to 3 µm, and preferably 0.5 µm to 1.5 µm. Accordingly, a surface roughness (Ra) of a surface among both surfaces of the first insulating layer 320, which comes into contact with the second insulating layer 324, may be greater than a surface roughness (Ra) of a surface among both surfaces of the first insulating layer 320, which comes into contact with the first substrate 310. For example, the surface roughness (Ra) of the surface among both surfaces of the first insulating layer 320, which comes into contact with the second insulating layer 324, may be formed to be 0.5 µm to 5 µm, preferably 0.75 µm to 4 µm, and more preferably 0.9 µm to 3 µm, and the first insulating layer 320 may have high bonding strength with the second insulating layer 324 and may also have high thermal conductivity. Here, the surface roughness (Ra) may be measured using a surface roughness meter. The surface roughness meter may measure a cross-sectional curve using a probe, and calculate the surface roughness using a peak line, a valley line, an average line, and a reference length of the cross-sectional curve. In the present specification, the surface roughness may refer to an arithmetic average roughness (Ra) acquired by a centerline average calculation method. That is, in the present specification, the surface roughness (Ra) may refer to an average value of absolute values of lengths from a center line of a roughness surface to the cross-sectional curve within the reference length. The surface roughness (Ra) may be acquired through the following Equation 2.

$$R_a = \frac{1}{L}\int_0^L |f(x)|dx \quad \text{[Equation 2]}$$

That is, when the cross-sectional curve acquired using the probe of the surface roughness meter is extracted as much as a reference length L and expressed as the function (f(x)) with an average line direction set to an x-axis and a height direction set to a y-axis, the value acquired by Equation 2 may be expressed in micrometers.

Like the above, when the surface roughness (Ra) of the surface among both surfaces of the first insulating layer 320, which comes into contact with the second insulating layer 324, is formed to be 0.5 µm to 5 µm, preferably 0.75 µm to 4 µm, and more preferably 0.9 µm to 3 µm, a contact area between the first insulating layer 320 and the second insulating layer 324 increases, and accordingly, the bonding strength between the first insulating layer 320 and the second insulating layer 324 may be improved. Specifically, when the second insulating layer 324 is formed of a resin layer, since the resin layer of the second insulating layer 324 easily permeates between grooves formed by the surface roughness of the first insulating layer 320, the bonding strength between the first insulating layer 320 and the second insulating layer 324 may be further improved. Further, when the surface roughness of the first insulating layer 320 and a recess of the second insulating layer 324 vertically overlap, shear modulus may be improved, and a phenomenon in which the substrate is bent due to thermal stress or the like may be improved. Here, the recess of the second insulating layer 324 may refer to a region where the first electrode 330 is disposed.

Hereinafter, the bonding performance and thermal conductivity of structures according to the embodiment of the present invention will be described using Comparative Examples and an embodiment.

In the embodiment, after coating a silicone-aluminum composite, in which aluminum oxide having a particle size distribution of 0.5 µm to 1 µm and having a particle size D50 of 0.8 µm is dispersed, to a thickness of approximately 23 µm on a copper substrate having a thickness of 0.3 mm and curing the same, a silicone-aluminum composite in which aluminum oxide having a particle size distribution of 7 µm to 12 µm and a particle size D50 of 9 µm is dispersed was coated to a thickness of approximately 12 µm and cured to form the first insulating layer 320. Further, after screen-printing a resin composition including PDMS and aluminum oxide on the first insulating layer 320 to a thickness of 50 µm to form the second insulating layer 324, the electrodes 330 were compressed and thermally cured.

In Comparative Example 1, the first insulating layer 320 was formed by coating a silicone-aluminum composite, in which aluminum oxide having a particle size distribution of 0.5 µm to 1 µm and having a particle size D50 of 0.8 µm is dispersed, to a thickness of approximately 35 µm on a copper substrate having a thickness of 0.3 mm and curing the same. Further, after screen-printing a resin composition including PDMS and aluminum oxide on the first insulating layer 320 to a thickness of 50 µm to form the second insulating layer 324, the electrodes 330 were compressed and thermally cured.

In Comparative Example 2, the first insulating layer 320 was formed by coating a silicone-aluminum composite, in which aluminum oxide having a particle size distribution of 7 µm to 12 µm and having a particle size D50 of 9 µm is dispersed, to a thickness of approximately 35 µm on a copper substrate having a thickness of 0.3 mm and curing the same. Further, after screen-printing a resin composition including PDMS and aluminum oxide on the first insulating layer 320 to a thickness of 50 µm to form the second insulating layer 324, the electrodes 330 were compressed and thermally cured.

In Comparative Example 3, the first insulating layer 320 was formed by coating a silicone-aluminum composite, in which aluminum oxide having a particle size distribution of 0.5 µm to 1 µm and having a particle size D50 of 0.8 µm and aluminum oxide having a particle size distribution of 7 µm to 12 µm and having a particle size D50 of 9 µm are dispersed in a weight ratio of 2:1, to a thickness of approximately 35 µm on a copper substrate having a thickness of 0.3 mm and curing the same. Further, after screen-printing a resin composition including PDMS and aluminum oxide on the first insulating layer 320 to a thickness of 50 µm to form the second insulating layer 324, the electrodes 330 were compressed and thermally cured.

FIG. 7A is a cross-sectional view of a bonding structure according to the embodiment, FIG. 7B is a cross-sectional view of a bonding structure according to Comparative Example 1, FIG. 7C is a cross-sectional view of a bonding structure according to Comparative Example 2, and FIG. 7D is a cross-sectional view of a bonding structure according to Comparative Example 3. Table 1 is a result of comparing withstand voltage evaluation, surface roughness (Ra), bonding strength (N), and thermal conductivity (W/mK) of the embodiment and Comparative Examples 1 to 3. Here, the withstand voltage performance may refer to a characteristic in which the bonding structure is maintained without dielectric breakdown for one minute under a condition of an alternating current (AC) voltage of 2.5 kV, a current of 10 mA, and 60 Hz. The withstand voltage performance was measured by a method of disposing an insulating layer on a substrate, and then connecting one terminal to the substrate and connecting different terminals to nine points on the insulating layer to test whether the bonding structure is maintained without dielectric breakdown for one minute under the condition of an AC voltage of 2.5 kV, a current of 10 mA, and 60 Hz. Further, shear stress was measured using a force that damages the bonding between the first insulating layer and the second insulating layer with respect to three electrodes using a push-pull gauge.

TABLE 1

| Experimental number | Number of first insulating layers | Withstand voltage evaluation | Surface roughness (Ra, μm) | Bonding strength (N) | Thermal conductivity (W/mK) |
|---|---|---|---|---|---|
| Embodiment | 2 | Pass | 1.004 | 187, 191, 195 | 12.6 |
| Comparative Example 1 | 1 | Pass | 0.183 | 43, 39, 42 | 13.8 |
| Comparative Example 2 | 1 | pass | 1.122 | 219, 223, 223 | 8.2 |
| Comparative Example 3 | 1 | pass | 0.210 | 51, 55, 56 | 14.1 |

Referring to Table 1, it can be seen that all of the embodiment and Comparative Examples 1 to 3 having structures of the first insulating layer and the second insulating layer passed the withstand voltage evaluation. Although both the bonding strength and the thermal conductivity are high in the embodiment, it can be seen that the thermal conductivity is high but the surface roughness (Ra) and the bonding strength are significantly low in Comparative Example 1 including the first insulating layer 320 which includes only aluminum oxide having a particle size distribution of 0.5 μm to 1 μm and a particle size D50 of 0.8 μm, and the surface roughness (Ra) and the bonding strength are high but the thermal conductivity is significantly low in Comparative Example 2 including the first insulating layer 320 which includes only aluminum oxide having a particle size distribution of 7 μm to 12 μm and a particle size D50 of 9 μm. Further, it can be seen that the large-sized aluminum oxide sinks down, and thus there is no effect of increasing the surface roughness (Ra) and the bonding strength in Comparative Example 3 including the first insulating layer 320 which includes both of aluminum oxide having a particle size distribution of 0.5 μm to 1 μm and a particle size D50 of 0.8 μm and aluminum oxide having a particle size distribution of 7 μm to 12 μm and a particle size D50 of 9 μm, but has no layer division. Meanwhile, referring to FIG. 5 again, the first insulating layer 320 and the second insulating layer 324 are sequentially disposed between the first substrate 310 and the first electrodes 330, and the third insulating layer 370 is disposed between the second electrodes 360 and the second substrate 380. In this case, the third insulating layer 370 may be formed of a resin layer including at least one of an epoxy resin composition including an epoxy resin and an inorganic filler and a silicone resin composition including polydimethylsiloxane (PDMS). Accordingly, the third insulating layer 370 may improve insulating properties, bonding strength, and thermal conductivity between the second electrodes 360 and the second substrate 380. In this case, at least one of the composition, thickness, hardness, modulus of elasticity, tensile strength, elongation rate, and Young's modulus of the third insulating layer 370 may be the same as or different from at least one of the composition, thickness, hardness, modulus of elasticity, tensile strength, elongation rate, and Young's modulus of the second insulating layer 324. For example, according to the positions of the high-temperature portion and the low-temperature portion of the thermoelectric element 300, at least one of the composition, thickness, hardness, modulus of elasticity, tensile strength, elongation rate, and Young's modulus of the third insulating layer 370 may be different from at least one of the composition, thickness, hardness, modulus of elasticity, tensile strength, elongation rate, and Young's modulus of the second insulating layer 324.

FIG. 8 is a cross-sectional view of a thermoelectric element according to another embodiment of the present invention, FIG. 9 is a cross-sectional view of a thermoelectric element according to still another embodiment of the present invention, and FIG. 10 is a cross-sectional view of a thermoelectric element according to yet another embodiment of the present invention. Since the contents related to the first insulating layer 320 and the second insulating layer 324 are the same as the contents described with reference to FIGS. 5 to 7, overlapping descriptions will be omitted.

Referring to FIG. 8, a thermoelectric element 300 may have a structure which is symmetrical between a first substrate 310 and first electrodes 330 and between a second substrate 380 and second electrodes 360. That is, a first insulating layer 320 and a second insulating layer 324 may be sequentially disposed between the first substrate 310 and the first electrodes 330, and a third insulating layer 370 and a fourth insulating layer 374 may be sequentially disposed between the second electrodes 360 and the second substrate 380. In this case, the third insulating layer 370 may be formed of a resin layer including at least one of an epoxy resin composition including an epoxy resin and an inorganic filler and a silicone resin composition including polydimethylsiloxane (PDMS), and the fourth insulating layer 374 may include a composite including silicon and aluminum like the first insulating layer 320. Like the case in which a surface roughness (Ra) of 0.5 μm to 5 μm is formed on a surface among both surfaces of the first insulating layer 320, which comes into contact with the second insulating layer 324, a surface roughness (Ra) of 0.5 μm to 5 μm may also be formed on a surface among both surfaces of the fourth insulating layer 374, which comes into contact with the third insulating layer 370.

Alternatively, referring to FIGS. 9 and 10, a first insulating layer 320 and a second insulating layer 324 may be sequentially disposed between a first substrate 310 and first electrodes 330, and a third insulating layer 370 may be disposed between second electrodes 360 and a second substrate 380. In this case, the third insulating layer 370 may be formed of a resin layer including at least one of an epoxy resin composition including an epoxy resin and an inorganic filler and a silicone resin composition including polydimethylsiloxane (PDMS).

Further, the second substrate 380 may be an aluminum substrate, and an aluminum oxide layer 376 may be further disposed between the third insulating layer 370 and the second substrate 380. In this case, the aluminum oxide layer 376 may be an aluminum oxide layer separately stacked on the second substrate 380 or an aluminum oxide layer oxidized by surface treatment of the second substrate 380 which is an aluminum substrate. For example, the aluminum oxide layer may be formed by anodizing the second substrate 380 which is an aluminum substrate, or may be formed by a dipping process or a spray process.

In this case, as shown in FIG. 9, the aluminum oxide layer 376 may be formed not only on a surface on which the third insulating layer 370 is disposed among both surfaces of the second substrate 380 but also on a surface opposite the surface on which the third insulating layer 370 is disposed.

Alternatively, as shown in FIG. 10, the aluminum oxide layer 376 may be disposed on the entire surface of the second substrate 380.

Accordingly, the aluminum oxide layer 376 may improve withstand voltage performance without increasing the thermal resistance at the second substrate 380 side, and may prevent the corrosion of a surface of the second substrate 380. When the first substrate 310 is disposed on a high-temperature portion of the thermoelectric element 300 and the second substrate 380 is disposed on a low-temperature portion of the thermoelectric element 300, in order to optimize thermal conductivity performance and withstand voltage performance, the first substrate 310 may be a copper substrate, and the second substrate 380 may be an aluminum substrate. In this case, when an aluminum oxide layer is further disposed on the aluminum substrate like the embodiments in FIGS. 9 and 10, a withstand voltage of the aluminum substrate may be increased. Specifically, since the aluminum oxide layer may be easily formed by anodizing an aluminum substrate, a manufacturing process may be simplified.

Meanwhile, as described above, according to the embodiment of the present invention, a heat sink may be bonded to at least one of the first substrate 310 and the second substrate 380.

FIG. 11 illustrates a bonding structure of the thermoelectric element according to one embodiment of the present invention.

Referring to FIG. 11, the thermoelectric element 300 may be fastened by a plurality of fastening members 400. For example, when a heat sink 390 is disposed on the first substrate 310, the plurality of fastening members 400 may fasten the heat sink 390 and the first substrate 310, fasten the heat sink 390, the first substrate 310 and the second substrate (not shown), fasten the heat sink 390, the first substrate 310, the second substrate (not shown), and a cooling unit (not shown), fasten the first substrate 310, the second substrate (not shown), and the cooling unit (not shown), or fasten the first substrate 310 and the second substrate (not shown). Alternatively, the second substrate (not shown) and the cooling unit (not shown) may be connected through other fastening members outside an effective area on the second substrate (not shown).

To this end, through-holes S through which the fastening members 400 pass may be formed in the heat sink 390, the first substrate 310, the second substrate (not shown), and the cooling unit (not shown). Here, separate insulating insertion members 410 may be further disposed between the through holes S and the fastening members 400. The separate insulating insertion member 410 may be an insulating insertion member surrounding an outer circumferential surface of the fastening member 400 or an insulating insertion member surrounding a wall surface of the through hole S. Accordingly, it is possible to increase an insulating distance of the thermoelectric element.

Meanwhile, a shape of the insulating insertion member 410 may be the same as illustrated in FIGS. 11A and 11B. For example, as illustrated in FIG. 11A, the insulating insertion member 410 may be disposed to form a step in a region in the through hole S formed in the first substrate 310 to surround a portion of the wall surface of the through hole S. Alternatively, the insulating insertion member 410 may be disposed to form a step in a region in the through hole S formed in the first substrate 310 to extend up to a first surface on which the second electrode (not shown) is disposed along the wall surface of the through hole S.

Referring to FIG. 11A, a diameter d2' of the through hole S of a first surface of the first substrate 310, which comes into contact with the first electrode, may be the same as a diameter of a through hole of a first surface of the second substrate, which comes into contact with the second electrode. In this case, according to the shape of the insulating insertion member 410, the diameter d2' of the through hole S formed in the first surface of the first substrate 310 may be different from a diameter d2 of a through hole S formed in a second surface opposite the first surface. Although not shown in the drawing, when the insulating insertion member 410 is disposed only on a portion of an upper surface of the first substrate 310 without forming the step in a region in the through hole S, or the insulating insertion member 410 is disposed to extend up to a part or all of the wall surface of the through hole S from the upper surface of the first substrate 310, the diameter d2' of the through hole S formed in the first surface of the first substrate 310 may be the same as the diameter d2 of the through hole S formed in the second surface opposite the first surface.

Referring to FIG. 11B, due to the shape of the insulating insertion member 410, the diameter d2' of the through hole S of the first surface of the first substrate 310, which comes into contact with the first electrode, may be greater than the diameter of the through hole of the first surface of the second substrate, which comes into contact with the second electrode. In this case, the diameter d2' of the through hole S of the first surface of the first substrate 310 may be 1.1 to 2.0 times the diameter of the through hole of the first surface of the second substrate. When the diameter d2' of the through hole S of the first surface of the first substrate 310 is less than 1.1 times the diameter of the through hole of the first surface of the second substrate, an insulation effect of the insulating insertion member 410 is insignificant and thus dielectric breakdown of the thermoelectric element may occur, and when the diameter d2' of the through hole S of the first surface of the first substrate 310 exceeds 2.0 times the diameter of the through hole of the first surface of the second substrate, since a size of a region occupied by the through hole S relatively increases, an effective area of the first substrate 310 may be reduced, and the efficiency of the thermoelectric element may be reduced.

Further, due to the shape of the insulating insertion member 410, the diameter d2' of the through hole S formed in the first surface of the first substrate 310 may be different from the diameter d2 of the through hole S formed in the second surface opposite the first surface. As described above, when the step is not formed in a region in the through hole S of the first substrate 310, the diameter d2' of the through hole S formed in the first surface of the first substrate 310 may be the same as the diameter d2 of the through hole S formed in the second surface opposite the first surface.

In the present specification, an example in which the first substrate 310 is a substrate at a high-temperature portion side and the second substrate 380 is a substrate at a low-temperature portion side is described, but the present invention is not limited thereto. The first substrate 310 may also be a substrate at a low-temperature portion side, and the second substrate 380 may also be a substrate at a high-temperature portion side.

Although not shown in the drawings, when the thermoelectric element according to the embodiment of the present invention is applied to a power generation device using the Seebeck effect, the thermoelectric element may be coupled to a first fluid flow unit and a second fluid flow unit. The first fluid flow unit may be disposed on one of the first and second substrates of the thermoelectric element, and the second fluid flow unit may be disposed on the other of the first and second substrates of the thermoelectric element. A flow path may be formed in at least one of the first fluid flow unit and the second fluid flow unit so that at least one of a first fluid and a second fluid may flow, and in some cases, at least one of the first fluid flow unit and the second fluid flow unit may be omitted, and at least one of the first fluid and the second fluid may directly flow to the substrate of the thermoelectric element. For example, the first fluid may flow adjacent to one of the first substrate and the second substrate, and the second fluid may flow adjacent to the other. In this case, a temperature of the second fluid may be greater than a temperature of the first fluid. Accordingly, the first fluid flow unit may be referred to as a cooling unit. As another example, a temperature of the first fluid may be greater than a temperature of the second fluid. Accordingly, the second fluid flow unit may be referred to as a cooling unit. The heat sink 390 may be connected to a substrate of one of the first fluid flow unit and the second fluid flow unit to which the fluid having a greater temperature flows. An absolute value of a temperature difference between the first fluid and the second fluid may be 40° C. or more, preferably 70° C. or more, and more preferably 95° C. to 185° C.

When the thermoelectric element or a thermoelectric module according to the embodiment of the present invention is used in a transportation mechanism such as a ship, an automobile, or the like, power may be generated using waste heat discharged from an exhaust side of an engine, and generated energy may be stored in a battery of the transportation mechanism to be supplied to various devices in the transportation mechanism, for example, a lighting device, a gas circulation device, and the like. When the thermoelectric element according to the embodiment of the present invention is disposed at an intake side of the engine, the thermoelectric element according to the embodiment of the present invention may be used as a temperature control device as well as a power generation device. When the thermoelectric element according to the embodiment of the present invention is used as a temperature control device, the fuel efficiency of the engine may be improved by lowering the temperature of gas injected into the engine to increase the amount of gas injected into the engine. Accordingly, the engine in the transportation mechanism and the thermoelectric element according to the embodiment of the present invention may influence each other, and may have functional integrity or technical interoperability. Further, in the shipping industry and transportation industry using the transportation mechanism to which the thermoelectric element according to the embodiment of the present invention is applied, since a reduction in transportation costs and an eco-friendly industrial environment may be created due to the thermoelectric element according to the embodiment of the present invention, it is possible to achieve functional integrity or technical interoperability with the thermoelectric element according to the present invention.

When the thermoelectric element according to the embodiment of the present invention is used in a power plant, the efficiency of a used fuel compared to produced energy may be controlled using heat generated in the power plant, and accordingly, the thermoelectric element according to the embodiment of the present invention and the power plant may achieve functional integrity or technical interoperability by adjusting energy production costs and an eco-friendly industrial environment.

When the thermoelectric element according to the embodiment of the present invention is used in a plant such as a steel mill or the like, the consumption of energy used in the plant may be reduced by producing energy through power generation using waste heat generated in the plant, and when the thermoelectric element is used as a temperature control device, since temperature control is performed in the manufacturing step of a product or in the plant, it affects other configurations of the plant, and thus the thermoelectric element according to the embodiment of the present invention and other configurations of the plant may achieve functional integrity or technical interoperability.

The thermoelectric element according to the embodiment of the present invention may be used as a temperature sensor of a wireless network or a small power supply device for supplying energy to the sensor. That is, since permanent energy supply to the sensor the like may be achieved, the thermoelectric element may achieve functional integrity or technical interoperability with a wireless network system when used as a temperature sensor installed underground or a power supply device of the temperature sensor.

The thermoelectric element according to the embodiment of the present invention may be used as a temperature control device, and may achieve functional integrity or technical interoperability through a function of controlling the temperature of an electric vehicle or battery charging device to improve stability of the electric vehicle or battery charging device when used in the electric vehicle, the battery charging device, or the like.

Although the preferable embodiments of the present invention are described above, those skilled in the art may variously modify and change the present invention within the scope and spirit of the present invention disclosed in the following claims.

The invention claimed is:
1. A thermoelectric element comprising:
a first substrate;
a first insulating layer disposed on the first substrate;
a second insulating layer disposed on the first insulating layer;
a first electrode disposed on the second insulating layer;
a semiconductor structure disposed on the first electrode;
a second electrode disposed on the semiconductor structure; and
a second substrate disposed on the second electrode,
wherein a composition of the first insulating layer is different from a composition of the second insulating layer,
the first insulating layer includes a first region disposed on the first substrate and a second region disposed between the first region and the second insulating layer, and
a particle size (D50) of an inorganic filler included in the second region is greater than a particle size (D50) of an inorganic filler included in the first region.

2. The thermoelectric element of claim 1, wherein a thickness of the first region is greater than a thickness of the second region.

3. The thermoelectric element of claim 2, wherein the thickness of the first region is 1.2 to 3 times the thickness of the second region.

4. The thermoelectric element of claim 3, wherein the thickness of the first region is 1.5 to 2.5 times the thickness of the second region.

5. The thermoelectric element of claim 2, wherein:
the particle size (D50) of the inorganic filler included in the second region is 5 µm to 15 µm; and the particle size (D50) of the inorganic filler included in the first region is 0.1 µm to 3 µm.

6. The thermoelectric element of claim 5, wherein an arithmetic average roughness (Ra) of a surface facing the second insulating layer in the second region is 0.5 µm to 5 µm.

7. The thermoelectric element of claim 1, wherein the inorganic filler of at least one of the first region or the second region includes aluminum oxide.

8. The thermoelectric element of claim 1, wherein a portion of a side surface of the first electrode is embedded in the second insulating layer.

9. The thermoelectric element of claim 8, wherein:
the first insulating layer includes a composite including at least one of an Al—Si bond, an Al—O—Si bond, an Si—O bond, an Al—Si—O bond, and an Al—O bond; and
the second insulating layer is a resin layer formed of a resin composition including at least one of an epoxy resin and a silicone resin and an inorganic filler.

10. The thermoelectric element of claim 8, wherein a height of the side surface of the first electrode embedded in the second insulating layer is 0.1 to 1 times a thickness of the first electrode.

11. The thermoelectric element of claim 1, wherein the second region comes into contact with the second insulating layer.

12. The thermoelectric element of claim 11, wherein a surface roughness Ra of a surface coming into contact with the second insulating layer among both surfaces of the first insulating layer is greater than a surface roughness Ra of a surface coming into contact with the first substrate among both surfaces of the first insulating layer.

13. The thermoelectric element of claim 12, wherein a resin composition in the second insulating layer permeates between grooves formed by the surface roughness Ra of the surface coming into contact with the second insulating layer among both surfaces of the first insulating layer.

14. The thermoelectric element of claim 1, wherein a silicon content in the first insulating layer is greater than a silicon content in the second insulating layer, and an aluminum content in the second insulating layer is greater than an aluminum content in the first insulating layer.

15. A thermoelectric element comprising:
a substrate;
an insulating layer disposed on the substrate;
an electrode disposed on the insulating layer; and
a semiconductor structure disposed on the electrode,
wherein the insulating layer includes a first region disposed on the substrate, a second region disposed on the first region, and a third region disposed on the second region and where a portion of a side surface of the electrode is embedded in the third region, and
a particle size (D50) of an inorganic filler included in the second region is greater than a particle size (D50) of an inorganic filler included in the first region.

16. The thermoelectric element of claim 15, wherein:
the particle size (D50) of the inorganic filler included in the second region is 5 µm to 15 µm;
the particle size (D50) of the inorganic filler included in the first region is 0.1 µm to 3 µm; and
a thickness of the first region is 1.2 to 3 times a thickness of the second region.

17. The thermoelectric element of claim 15, wherein the second region comes into contact with the third region.

18. The thermoelectric element of claim 17, wherein a surface roughness Ra of a surface coming into contact with the third region among both surfaces of the second region is greater than a surface roughness Ra of a surface coming into contact with the substrate among both surfaces of the first region.

19. The thermoelectric element of claim 18, wherein a resin composition in the third region permeates between grooves formed by the surface roughness Ra of the surface coming into contact with the third region among both surfaces of the second region.

20. The thermoelectric element of claim 15, wherein a height of the side surface of the electrode embedded in the third region is 0.1 to 1 times a thickness of the electrode.

* * * * *